US012722126B2

(12) United States Patent
Schmieder et al.

(10) Patent No.: US 12,722,126 B2
(45) Date of Patent: Sep. 1, 2026

(54) DEVICE AND METHOD FOR SEPARATING PARTICLES IN A LIQUID, KIT CONTAINING THE DEVICE, AND APPLICATIONS OF THE DEVICE

(71) Applicants: FRAUNHOFER-GESELLSCHAFT ZUR FÖRDERUNG DER ANGEWANDTEN FORSCHUNG E.V., Munich (DE); TECHNISCHE UNIVERSITÄT DRESDEN, Dresden (DE); CELL.COPEDIA GMBH, Leipzig (DE)

(72) Inventors: Florian Schmieder, Dresden (DE); Maurice Langer, Dresden (DE); Konrad Katzer, Dresden (DE); Willhelm Gerdes, Leipzig (DE); Rommy Berthold, Leipzig (DE)

(73) Assignees: Fraunhofer-Gesellschaft zur Förderung der angewandten München, Forschung e. V., Munich (DE); Technische Universität Dresden, Dresden (DE); Cell.Copedia GmbH, Leipzig (DE)

( * ) Notice: Subject to any disclaimer, the term of this patent is extended or adjusted under 35 U.S.C. 154(b) by 446 days.

(21) Appl. No.: 18/259,516

(22) PCT Filed: Dec. 28, 2021

(86) PCT No.: PCT/EP2021/087733
§ 371 (c)(1),
(2) Date: Jun. 27, 2023

(87) PCT Pub. No.: WO2022/144359
PCT Pub. Date: Jul. 7, 2022

(65) Prior Publication Data

US 2024/0316506 A1 Sep. 26, 2024

(30) Foreign Application Priority Data

Dec. 28, 2020 (DE) ..................... 10 2020 216 579.3

(51) Int. Cl.
*B01D 69/02* (2006.01)
*B01D 61/14* (2006.01)
(Continued)

(52) U.S. Cl.
CPC ......... *B01D 69/02* (2013.01); *B01D 61/1471* (2022.08); *B01D 61/18* (2013.01);
(Continued)

(58) Field of Classification Search
None
See application file for complete search history.

(56) References Cited

U.S. PATENT DOCUMENTS 10,369,561 B2 8/2019 Stadler et al.
2015/0299415 A1 10/2015 Kennedy et al.
(Continued)

FOREIGN PATENT DOCUMENTS

DE 102012016375 A1 2/2014
DE 102012016378 A1 2/2014
(Continued)

OTHER PUBLICATIONS

European Patent Office, International Search Report in International Application No. PCT/EP2021/087733 (Apr. 19, 2022).
(Continued)

*Primary Examiner* — Krishnan S Menon
(74) *Attorney, Agent, or Firm* — Leydig, Voit & Mayer, Ltd.

(57) ABSTRACT

The invention relates to a device, a method, and a kit for separating particles of different sizes in a liquid. The invention additionally relates to applications of the device. The
(Continued)

Figure 1:
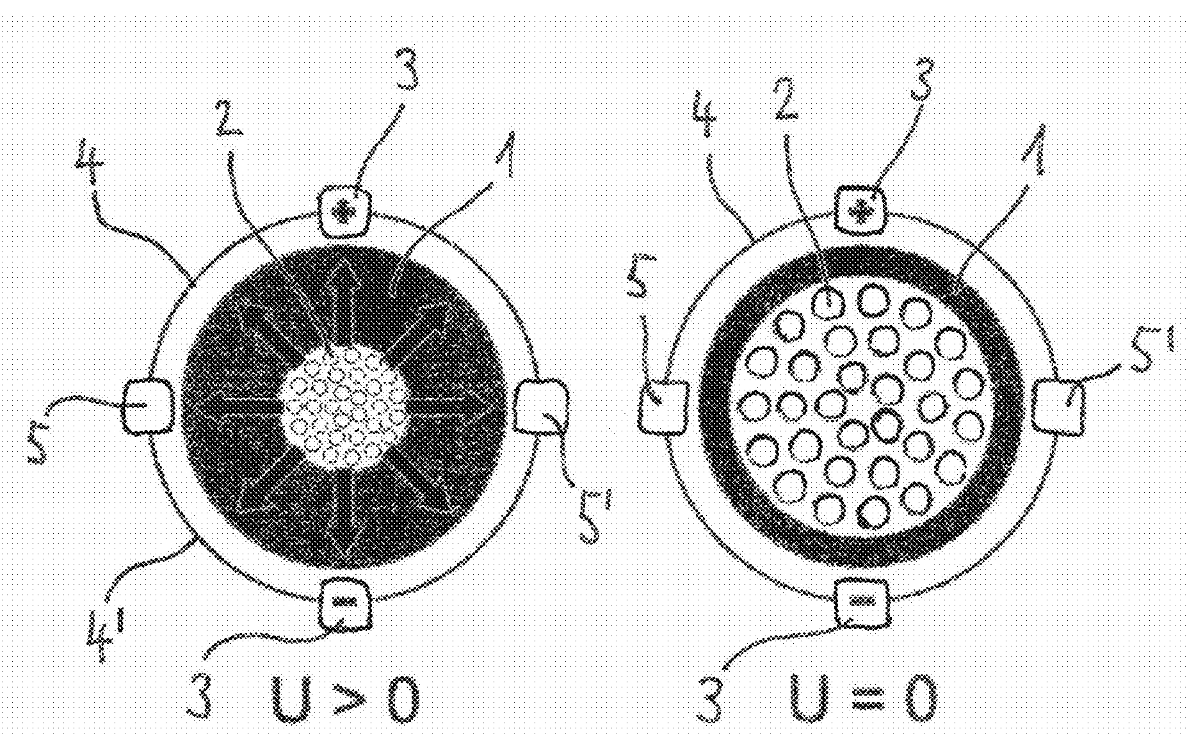

device and the method involve the capability of binding particles to solid phase particles with different diameters in a liquid, whereby the hydrodynamic diameter of the solid-phase particles determines whether the particles can pass through pores of a filter element, the diameter of said pores being modifiable in a controlled manner (e.g., the diameter can be increased or decreased). Thus, particles of equal size (e.g., B-cells and T-cells) of a liquid can be separated from one another with a high degree of separation efficiency, wherein the particles can be separated simply, quickly, and inexpensively. High yields can be produced, and the particles can be provided in a therapeutically applicable liquid.

20 Claims, 5 Drawing Sheets

(51) Int. Cl.
*B01D 61/18* (2006.01)
*B01D 67/00* (2006.01)
*H10N 30/20* (2023.01)
*H10N 30/857* (2023.01)

(52) U.S. Cl.
CPC .. *B01D 67/0032* (2013.01); *B01D 2325/0212* (2022.08); *B01D 2325/028* (2013.01); *B01D 2325/26* (2013.01); *H10N 30/2047* (2023.02); *H10N 30/857* (2023.02)

(56) References Cited

U.S. PATENT DOCUMENTS

2016/0199561 A1 7/2016 Dacey, Jr. et al.
2017/0296979 A1 10/2017 Swett et al.
2017/0361314 A1 12/2017 Stadler et al.
2018/0290106 A1 10/2018 Kubis

FOREIGN PATENT DOCUMENTS

DE 102016213565 A1 1/2018
WO WO 00/54866 A1 9/2000
WO WO 2016/092025 A1 6/2016

OTHER PUBLICATIONS

European Patent Office, Written Opinion in International Application No. PCT/EP2021/087733 (Apr. 19, 2022).
International Bureau of WIPO, International Preliminary Report on Patentability in International Application No. PCT/EP2021/087733 (Jul. 4, 2023).
Wandera et al., "Stimuli-responsive membranes," *Journal of Membrane Science* 357(1-2): 6-35 (2010).
European Patent Office, Communication pursuant to Article 94(3) EPC in European Patent Application No. 21 847 706.5 (May 24, 2024).
U.S. Appl. No. 18/259,185, filed Jun. 23, 2023.

DEVICE AND METHOD FOR SEPARATING PARTICLES IN A LIQUID, KIT CONTAINING THE DEVICE, AND APPLICATIONS OF THE DEVICE

CROSS-REFERENCE TO RELATED APPLICATIONS

This patent application is the U.S. national phase of International Application No. PCT/EP2021/087733, filed on Dec. 28, 2021, which claims the benefit of German Patent Application No. 10 2020 216 579.3, filed Dec. 28, 2020.

A device, a method, and a kit for separating particles of different sizes in a liquid is provided. Uses of the device are additionally provided. The device and the method are based on particles in a liquid being able to bind to solid phase particles having different diameters, whereby the hydrodynamic diameter of the solid phase particles determines whether the particles can pass through pores of a filter element whose diameter can be changed (e.g., made larger or smaller) in a targeted manner. Particles of the same size (e.g., B cells and T cells) of a liquid can thus be separated from one another with a high separation effect, with the separation of the particles being able to take place in a simple, fast, and inexpensive manner. High yields can also be implemented and the particles can be provided in a therapeutically usable liquid.

A large number of cell based isolation processes require the use of technical membranes to separate molecules or particles of different sizes from one another. Previously used membranes have a predefined pore size or mesh size. Components whose sizes exceed the pore size are hereby held back while smaller components can pass through the membrane. In a large number of separation processes, such as in the filtration of particles from blood, more than two particles of different sizes (i.e., blood cells and/or endosomal vesicles of different sizes) should, however, be separated in high purity quality. Currently, price intensive and complex multistage processes or serial connections of membranes of different pore sizes are required for this purpose.

A method and a device are known in the prior art via which a specific kind of particles of a liquid (e.g., specific cells from whole blood) can be separated from the other particles of this liquid in a specific manner (see WO 2016/092025 A1). The method and the device are based on a specific binding of the target particles (e.g., target cells) via low affinity fab fragments with solid phase particles that are immobilized between two membranes of a membrane cartridge. The target particles can bind to the modified solid phase particles and other particles (e.g., cells) that have a smaller diameter than the pore diameter of the two membranes and/or do not bind to the solid phase particles are separated from the target particles.

The target cells can be provided at high purity and yield using this known method. A provision of a plurality of blood cell fractions having a respective kind of particle is, however, not possible in a single step or in a single device (membrane cartridge) due to the fixedly specified pore sizes of the membranes used in this method and in this device (e.g., 45 μm) and to the specific affinity of the fab fragments to the target cells. Additionally, only a small blood sample volume is often available. A successful carrying out of a separation process after a splitting of this small sample volume over a plurality of membrane cartridges having differently modified solid phase particles is frequently not possible. There is thus a need for a method by which a separation of a liquid having particles into a plurality of fractions that each include a specific kind of article is possible in a single device.

A filter element for separating unwanted components from a fluid stream is known from the prior art in which the pore diameter of the pores of the filter element can be changed by applying an electrical voltage to the filter element and/or by the action of a mechanical force on the filter element (see e.g., DE 10 2016 213 565 A1). It is disadvantageous with this filter element that the change of the pore size simultaneously effects a change of the cross-sectional surface of the pores (e.g., from a rectangular cross-section to a rhomboid cross-section or from a round cross-section to an oval cross-section) and the selectivity of the filter elements to allow particles of a specific geometry to pass cannot be set with a high precision.

Membranes are furthermore known from the prior art that comprise or consist of dielectric elastomers (see e.g., DE 10 2012 016 375 A1). It is furthermore known that these membranes can be structured via the effect of electromagnetic radiation (e.g., of a laser) (see e.g., DE 10 2012 016 378 A1).

Starting from this, it was the object of the present invention to provide a device, and a method for separating particles in a liquid that do not have the disadvantages from the prior art. It should in particular be possible by the device and the method not only to separate particles of different sizes (e.g., biological cells and/or endosomes of different sizes) of a liquid from one another with a high separation effect, but also to separate particles of the same size (e.g., B cells and T cells) from one another. The particles separated from one another should be able to be provided in a simple, fast, and inexpensive manner and at a high yield even with small liquid volumes. The particles should additionally be able to be provided in a therapeutically usable liquid. Uses of the device should furthermore be provided.

The object is achieved by the features of the device, kit, method, and use described herein and the advantageous developments thereof.

In accordance with the invention, a device for separating particles in a liquid is provided comprising a) a container for receiving a liquid (suspension);

b) an areal filter element having an upper side surface and a lower side surface, wherein the filter element has continuous pores having a defined pore diameter;

wherein the filter element is arranged in the container such that it divides the container into an upper compartment in the direction of the upper side surface of the filter element and into a lower compartment in the direction of the lower side surface of the container so that particles of a liquid in the upper compartment can only move into the lower compartment if they pass through the filter element, with the upper compartment of the container having an opening for receiving a liquid having particles, characterized in that the upper compartment of the container comprises at least one group of solid phase particles that have a specific hydrodynamic diameter and that expose at least one molecule at their surface that is suitable to specifically bind to a surface molecule of a first kind of particle; and the filter material comprises or consists of a material that is suitable to change, by application of an electrical voltage to the filter element and/or by the action of a mechanical force on the filter element, the pore diameter of its pores.

The term "continuous pores" means pores that extend from the upper side of the filter element down to the lower side of the filter element. The term "having a defined pore diameter" means that the pore diameter of all the pores of the filter element differ from one another by less than 10 μm, preferably less than 5 μm. The term "solid phase particles" also includes "gel particles".

It is possible using the device in accordance with the invention to carry out a separation of different particles in a liquid (or suspension) in a single device. It is furthermore possible also to separate particles of different kinds from one another that have substantially the same size (i.e., substantially the same hydrodynamic diameter) by the specific coupling of specific kinds of particles of the liquid (e.g., kinds of blood cell and/or kinds of vesicles in the blood) to solid phase particles of different sizes. The device in accordance with the invention thus has the advantage that not only particles of different sizes (e.g., biological cells and/or endosomes of different sizes) of a liquid (suspension) can be separated from one another with a high separation effect, but also particles of the same size (e.g., B cells and T cells) can be separated from one another. The separation of the particles of the same size is achieved by a coupling of the respective kind of particle to be separated to the solid phase particles that "impart" a defined particle size on the respective kind of particle. The device additionally permits particles separated from one another to be provided in a simple, fast, and inexpensive manner and at a high yield even with small liquid volumes. This is due to the fact that the pore diameter of the filter element of the device can be varied and a sequential separation of the particles of the liquid into a plurality of different devices that each comprise filter elements comprising different, fixed pore diameters is thus not necessary. The separated particles can furthermore be provided in a therapeutically usable liquid (for example its original liquid, e.g., blood plasma).

The device in accordance with the invention can be designed as a membrane cartridge.

The device can be characterized in that the upper compartment of the container comprises at least one second group of solid phase particles having a second hydrodynamic diameter, with the second hydrodynamic diameter differing from the first hydrodynamic diameter and with the at least one second group of solid phase particles exposing a molecule at their surface that is suitable to specifically bind to a surface molecule of a second kind of particle. This embodiment has the advantage that the not only one first kind of particle can be separated from other particles of the liquid in a targeted manner, but that also a second kind of particle can be separated from the first kind of particle and from other particles of the liquid.

Furthermore, the device can be characterized in that the upper compartment of the container comprises at least one third group of solid phase particles having a third hydrodynamic diameter, with the third hydrodynamic diameter differing from the first and second hydrodynamic diameters and with the third group of solid phase particles exposing a molecule at their surface that is suitable to specifically bind to a surface molecule of a third kind of particle. The upper compartment preferably comprises a fourth, fifth, sixth, seventh, eighth, ninth, and/or tenth group of solid phase particles respectively having a hydrodynamic diameter that differs from other groups of solid phase particles in the upper compartment and with the solid phase particles of the respective groups exposing a molecule at their surface that is suitable to specifically bind to a surface molecule of a respectively different kind of particle. The advantage of this embodiment is that at least three groups of particles in a liquid can be selectively separated from one another and from other particles of the liquid.

The at least one molecule that is exposed at the surface of the solid phase particles and that is suitable to specifically bind to a surface molecule of a first kind of particle can comprise or consist of a polypeptide chain, with the polypeptide chain preferably being selected from the group consisting of antibodies, antibody fragments, and derivatives thereof, particularly preferably being selected from the group consisting of a fab fragment or a derivative thereof.

This molecule can furthermore comprise or consist of a polynucleotide, with the polynucleotide preferably being selected from the groups consisting of DNA, RNA, and derivatives thereof.

This molecule can furthermore comprise or consist of an oligosaccharide.

It is preferred that this molecule is reversibly bound to the surface of the solid phase particles via noncovalent interactions, preferably such that the binding is releasable via a measure selected from the group consisting of changing a concentration of a substance, changing a temperature, changing the pH, and combinations thereof.

It is furthermore preferred that this molecule is suitable to specifically bind to a surface molecule of a kind of particle that has a smaller hydrodynamic diameter than the solid phase particles, preferably a hydrodynamic diameter that amounts to a maximum of 10%, preferably a maximum of 8%, particularly preferably a maximum of 6%, very particularly preferably a maximum of 4%, in particular a maximum of 2%, of the hydrodynamic diameter of the solid phase particles.

The device can have at least two electrically conductive layers that are connected to an electrical voltage source, preferably to an electrical voltage source of the device.

At least one of the at least two electrically conductive layers can be applied to the upper side of the filter element or can be applied to the lower side of the filter element. One of the two electrically conductive layers is preferably applied to the upper side of the filter element and other one of the two electrically conductive layers is applied to the lower side of the filter element.

The filter membrane can represent an electrically insulating layer. An electrical insulation layer toward the at least two electrically conductive layers may then be unnecessary.

At least one of the at least two electrically conductive layers, optionally the at least two electrically conductive layers, can furthermore contact at least one electrical insulation layer that is arranged between the at least one electrically conductive layer and the filter element, with the at least two electrically conductive layers optionally each contacting at least one electrical insulation layer that is arranged between the at least two electrically conductive layers and the filter element. It can be prevented in this embodiment that an electrical short circuit or a brief arc is produced between the first and the further electrically conductive layers. The electrical insulation layer can only be arranged on one side of the filter element (i.e., its upper side or lower side) or an electrical insulation layer can be arranged on both sides of the filter element.

At least one of the at least two electrically conductive layers, optionally the at least two electrically conductive layers, can furthermore be arranged in a marginal region of the pores of the filter element. This arrangement can be designed in a spot-like manner around the pores of the filter element.

At least one of the at least two electrically conductive layers, optionally the at least two electrically conductive layers, can furthermore be arranged fully around the pores of the filter element. In this case, the electrically conductive layer has continuous pores having a defined pore diameter at the same points as the filter element.

At least one of the at least two electrically conductive layers, optionally the at least two electrically conductive layers, can comprise or consist of a polymer, optionally an electrically conductive polymer.

In addition, at least one of the at least two electrically conductive layers, optionally the at least two electrically conductive layers, can comprise electrically conductive particles, preferably carbon particles, particularly preferably single-walled or multi-walled carbon nanotubes. The proportion of the electrically conductive particles is here optionally in the range from 0.001 to 30 wt %, preferably in the range from 0.01 to 3 wt %, with respect to the total weight of the electrically conductive layer. The advantage of this embodiment is that the electrically conductive layer is also electrically conductive when it (predominantly) consists of a non-electrically conductive polymer. Intrinsically conductive polymers without additional conductive additives (in the composite layer) would be a special case.

At least one of the at least two electrically conductive layers, optionally the at least two electrically conductive layers, can furthermore comprise or consist of a metal, with the metal preferably being arranged at the surface of the electrically conductive layer. If it comprises a metal, it can be present in the form of particles.

It is preferred that at least one of the at least two electrically conductive layers, optionally the at least two electrically conductive layers, is/are connected to the filter element or to an electrically insulating layer in a friction lock and/or in a material bond.

At least one of the at least two electrically conductive layers, optionally the at least two electrically conductive layers, can be applied to the filter element or to an electrically conductive layer via a process selected from the group consisting of pad printing, doctor knife coating, screen printing, inkjet printing, jetting, spraying, vaporization, and combinations thereof, optionally combined with a laser structuring process.

In a preferred embodiment, the device has an electrical voltage source that is electrically conductively connected to at least two electrically conductive layers of the device, is preferably connected to at least two electrically conductive layers, that are applied to the upper side and/or lower side of the filter element, of the device. The advantage here is that the pore diameter of the pores of the filter element can be changed via the application of an electrical voltage to the filter element.

In a further preferred embodiment, the device has a means that is suitable to vary the pore diameter of the pores of the filter element by the action of a mechanical force on said filter element, with the means being selected from the group consisting of a stamp for exerting a pressure on the filter element, a pneumatic device for exerting a pressure on the filter element, a bimetallic wire for exerting a pressure on the filter element, an NiTiCu alloy for exerting a pressure on the filter element, and combinations thereof. The advantage here is that the pore diameter of the pores of the filter element can be changed via the action of a mechanical force on the filter element.

The device can have a means that is suitable to apply an oscillating fluid flow, preferably a fluid flow that oscillates in a direction perpendicular to the upper side surface of the filter element, to the upper side surface of the filter element. The advantage here is that a possible clogging of the filter element during the separation of the particles is prevented.

The device can furthermore have a control unit that is configured to control an electrical voltage of a voltage source and/or a mechanical force on the filter element.

The control via the control unit preferably takes place such that an electrical voltage and/or a mechanical force on the filter element is changed step-wise in the course of a separation of particles in a liquid, with the variation preferably taking place automatically over the course of time or manually by an input of a user. The variation of the electrical voltage is in particular a reduction of the electrical voltage and the change of the mechanical force on the filter element is in particular an increase of the mechanical force on the filter element. It is the aim in this case to correspondingly widen the pore size.

The control via the control unit can furthermore take place such that the pore diameter of the pores of the filter element is changed in a range from 10 to 200 μm, preferably in a range from 20 to 180 μm, particularly preferably in a range from 30 to 160 μm, in particular in a range from 40 to 120 μm.

Apart from this, the control via the control unit can take place such that the pore diameter of the pores of the filter element is changed automatically over the course of time or manually by input(s) by a user of the device stepwise to a larger pore diameter, preferably in steps of 5 to 15 μm, particularly preferably in steps of 9 to 11 μm, very particularly preferably from a pore diameter of 10 μm up to a pore diameter of 200 μm, in particular from a pore diameter of 40 μm via a pore diameter of 50 μm, a pore diameter of 60 μm, a pore diameter of 70 μm, a pore diameter of 80 μm, a pore diameter of 90 μm, a pore diameter of 100 μm, a pore diameter of 110 μm, up to a pore diameter of 120 μm. An advantage of a DEA membrane as the filter element is that the pore size is not necessarily restricted to specified stages, but can be continuously changed by an electrical voltage and/or a mechanical force.

The device can have a means that is suitable to move the liquid having particles through the filter element.

This means preferably comprises or consists of a stamp that is arranged in a liquid tight and movable manner in the first compartment of the container. The advantage here is that a user can manually control the conveying of the liquid through the filter element via a movement of the stamp.

This means can furthermore comprise or consist of a pump, particularly preferably a pump that is configured to move a liquid having particles bidirectionally through the filter element. The advantage here is that a user can either manually control the conveying of the liquid through the filter element via a setting of a pump activity or can control it automatically (via a control unit of the device).

The filter element can comprise or consist of a material that is electroactive. The filter element can furthermore comprise or consist of a material that is piezoelectric. The filter element can furthermore comprise or consist of a material that is dielectric. The filter element can be a dielectric elastomer actuator (DEA). The advantage of these materials or of DEA is that the setting of the pore diameter of the filter element can take place via a variation of an electrical voltage applied to the filter element, with the shape of the cross-sectional surface of the pores not substantially varying or not varying at all by the variation of its diameter (e.g., the shape of the cross-section remains circular). The selectivity of the filter element can thereby be set more precisely than with other filter elements in which the shape of the cross-section of the pores also changes (e.g., changes from rectangular to rhomboid or changes from circular to oval) by a change of the pore diameter. The functional principle of a DEA is here based on the Maxwell stress tensor that is formed between two mutually separate, oppositely charged electrodes, similar to that of a capacitor. On the application of an electrical voltage, a potential difference between the electrodes is produced that results in a mechanical stress in the dielectric. The Maxwell stress provides an equibiaxial, linear movement and thus achieves the actual actuator effect that results in a change of the pore diameter of the pores of the filter element.

It is preferred that the filter element furthermore comprises or consists of a material that is elastic. Such a material permits a better setting of the pore diameter by the action of a mechanical force on the filter element. It is also advantageous for the setting of the pore diameter via application of an electrical voltage if the filter element comprises an elastic material (e.g., an elastomer). The macroscopic or mesoscopic actuator effect can thus also be influenced by the continuous settability of the electrical voltage. DEAs frequently comprise or consist of an incompressible elastomer. The filter element can consequently also comprise or consist of an incompressible material.

In a preferred embodiment, the filter element comprises or consists of a polymer, preferably an elastomer, particularly preferably a thermoplastic elastomer. The polymer is in particular selected from the group consisting of silicone elastomer, liquid rubber elastomer, and combinations thereof.

The filter element can have an extent from the upper side in the direction of the lower side in the range from ≤250 μm, preferably in the range from ≤200 μm, particularly preferably in the range from ≤150 μm, in particular in the range from ≤100 μm. It is the advantage of the small thickness of the filter element that the device can be provided in a lighter, more compact, and less expensive manner.

In a preferred embodiment, the filter element is pretensioned, preferably via an equibiaxial prestretching in the range between 50% and 150%. The pretension can be via a connection of the filter element to a fixed frame of the device. It is advantageous in the pretensioning that the original pore size of the pores of the filter element, i.e., the pore diameter of the pores of the filter element in an untensioned state (relaxed state) can be smaller than a pore size that is needed for the carrying out of a method for separating particles in a liquid. This can reduce the manufacturing costs of the filter element.

In a preferred embodiment, the filter element has continuous pores that have a substantially round cross-section. This is advantageous if the solid phase particles in the upper compartment of the device have a spherical shape (which is preferred) since the opening provided via the pores can thus be adapted to the sphere diameter of the solid phase particles in a defined manner.

The filter element is preferably suitable to vary the pore diameter of its continuous pores by the action of an electrical voltage on the filter element and/or by the action of a mechanical force on the filter element in a range from 10 to 200 μm, preferably in a range from 20 to 180 μm, particularly preferably in a range from 30 to 160 μm, very particularly preferably in a range from 40 to 120 μm. The suitability is in particular such that the variation of the pore diameter takes place isotropically in all the directions along a cross-sectional surface of the pores.

The particles to be separated can be selected from the group consisting of vesicles and biological cells, preferably selected from the group consisting of vesicles and biological cells of blood, particularly preferably selected from the group consisting of endosomal vesicles, exosomal vesicles, thrombocytes, erythrocytes, leukocytes, and combinations thereof.

The solid phase particles that are suitable to specifically bind to a surface molecule of a first kind of particle of the particles to be separated can comprise or consist of a polymer, with the polymer preferably being selected from the group consisting of plastic, agarose, and combinations thereof.

The solid phase particles can be solid phase spheres and can preferably have a substantially round shape (spherical shape). The (substantially) round shape is advantageous since the solid phase particles thus have (substantially) the same spatial extent (i.e., the same diameter) in all the directions of extent and their suitability for passing through a pore having a defined pore diameter can thus be predicted more accurately and is defined more exactly.

A kit is furthermore provided in accordance with the invention that comprises a device in accordance with the invention and comprises a unit and has at least one, preferably all, of the following means:

- a means that is suitable to apply an electrical voltage to the filter element, with the means preferably comprising or consisting of an electrical voltage source;
- a means that is suitable to apply an oscillating fluid flow, preferably a fluid flow that oscillates in a direction perpendicular to the upper side surface of the filter element, to the upper side surface of the filter element; and
- a means that is suitable to move the liquid having particles through the filter element, with the means preferably being selected from the group consisting of a stamp that is arranged in a liquid tight and movable manner in the first compartment of the container, a conveying device, preferably a pump, particularly preferably a pump that is configured to move a liquid having particles bidirectionally through the filter element, and combinations thereof.

A method for separating particles in a liquid is furthermore provided comprising the steps

- a) providing at least one group of solid phase particles that have a specific hydrodynamic diameter and that expose at least one molecule at their surface that is suitable to specifically bind to a surface molecule of a first kind of particle of the particles of the liquid;
- b) incubating the liquid having the at least one group of solid phase particles until the solid phase particles of the at least one group of solid phase particles have been specifically bound to a surface molecule of a first kind of particle of the particles of the liquid;
- c) providing a filter element that comprises or consists of a material that is suitable to change, by application of an electrical voltage to the filter element and/or by the action of a mechanical force on the filter element, the pore diameter of its pores;
- d) setting the pore diameter of the pores of the filter element via application of an electrical voltage to the filter element and/or the action of a mechanical force on the filter element so that only particles up to a desired particle diameter can pass through the filter element, with the set particle diameter being smaller than a hydrodynamic diameter of the at least one group of solid phase particles;
- e) moving the liquid through the filter element;
- f) isolating the liquid;

g) increasing the pore diameter of the pores of the filter element by reducing the power of the electrical voltage and/or by increasing the mechanical force on the filter element so that particles up to a desired, now larger particle diameter can pass through the filter element, with said particles preferably being the particles of the first kind of particle that are bound to the group of solid phase particles;
h) optionally adding a liquid that preferably does not comprise any particles to the liquid having the particles that have not passed through;
i) moving the liquid through the filter element;
j) isolating the liquid that comprises the particles of the first kind of particle;
k) optionally repeating steps g) to j) until all the particles of the liquid are present separated by their size in separate liquids.

The method can be characterized in that it is carried out using a device in accordance with the invention.

The method then preferably comprises the following steps:

i) setting the pore diameter of the pores of the filter element of the device via application of an electrical voltage to the filter element and/or the action of a mechanical force on the filter element so that only particles up to a desired particle diameter can pass through the filter element, with the set particle diameter being smaller than a hydrodynamic diameter of the at least one group of solid phase particles;
ii) filling the upper compartment of the container of the device with a liquid that comprises particles having different sizes;
iii) incubating the liquid in the upper compartment of the container of the device having the at least one group of solid phase particles until at least solid phase particles of the at least one group of solid phase particles have specifically bound to a surface molecule of a first kind of particle of the particles (e.g., a first kind of blood particles);
iv) moving the liquid through the filter element of the device into the lower compartment of the container;
v) isolating the liquid having the particles that have passed through from the lower compartment of the container of the device;
vi) increasing the pore diameter of the pores of the filter element of the device by reducing the power of the electrical voltage and/or by increasing a mechanical force on the filter element so that particles up to a desired, now larger particle diameter can pass through the filter element, with said particles preferably being the particles of the first kind of particle that are bound to the group of solid phase particles;
vii) optionally filling the upper compartment of the container of the device with a liquid that preferably does not comprise any particles;
viii) moving the liquid through the filter element of the device into the lower compartment of the container;
ix) isolating the liquid that comprises the particles of the first kind of particles from the lower compartment of the container of the device;
x) optionally repeating steps vi) to ix) until all the particles of the liquid are present separated by their size in separate liquids.

The use of the device in accordance with the invention and/or of the kit in accordance with the invention for separating particles of different sizes that are present in a liquid is furthermore proposed. The use can relate to an isolation of one or more blood cell fractions of blood, preferably for providing the blood cell fractions for diagnosis and/or for manufacturing blood preparations, in particular for producing cell therapeutics. The use can moreover relate to an isolation of bacteria cells of blood. The use can furthermore relate to an isolation of endosomal or exosomal vesicles of blood, blood serum, or biosuspensions, preferably for providing endosomal vesicles for diagnosis and/or for manufacturing vaccines. Apart from this, the use can relate to an isolation of tissue cells from mixed tissue cell fractions. The use can furthermore relate to an isolation of cells from mixed cell suspensions that originate from bioreactors, with the cells preferably being selected from the group consisting of plant cells, animal cells, human cells, bacteria cells, yeast cells, and combinations thereof.

The subject matter in accordance with the invention will be explained in more detail with reference to the following Figures and examples without intending to restrict it to the specific embodiments shown here.

FIG. 1 schematically shows a setting of the pore size of a filter element 1 that comprises or consists of an electroactive material. If a high electrical voltage (in the kV range) is applied by an electrical voltage source 3 to the filter element via two electrically conductive layers 4, 4' that are located at the side wall of a pore 2 and are separated from one another by an isolation layer 5, the pores 2 of the filter element 1 contract and the pore diameter of the pores 2 is comparatively small. If the voltage of the electrical voltage source 3 is reduced to zero, the pores 2 of the filter element 1 expand to a maximum value. The pore diameter of the pores 2 of the filter element 1 between the high voltage (e.g., some kV) and the voltage value zero can be set in a targeted and continuous manner.

Figure 2:
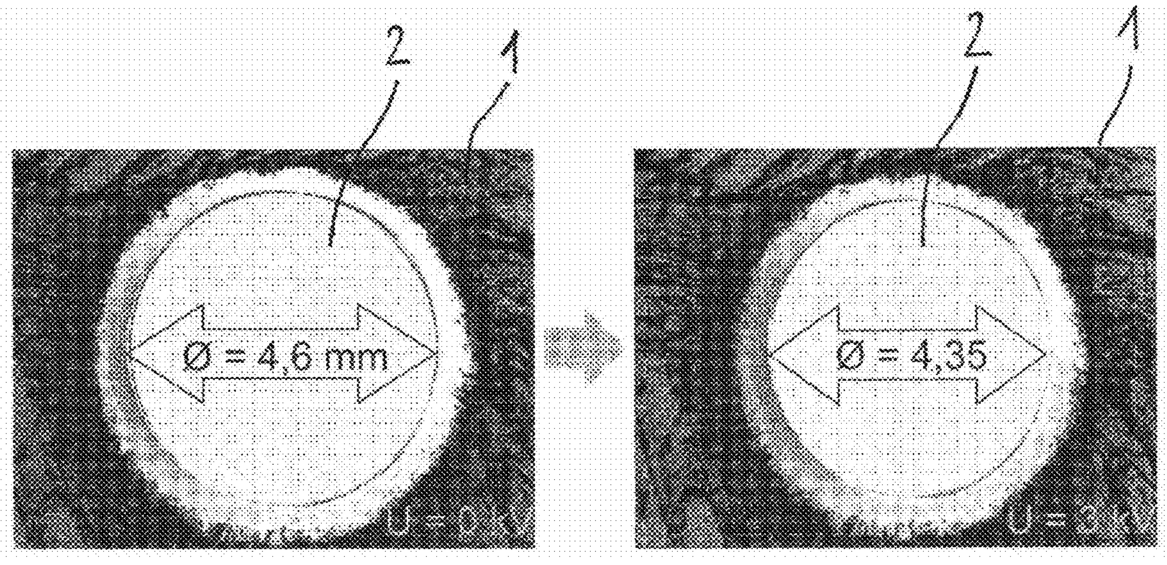

FIG. 2 shows a macroscopic recording of an expansion of an individual pore 2 of a filter element 1 that comprises or consists of an electroactive material in dependence on the applied electrical voltage. The filter element here is a DEA membrane. It can be recognized that the pore diameter of this pore 2 can be reduced from a diameter of 4.6 mm at an applied electrical voltage of zero to a pore diameter of 4.35 mm at an applied voltage of 3 kV (electrical field is applied to the filter element). The achieved reduction of the diameter of the pore 2 shown amounts to approximately 250 μm in this case.

Figure 3:
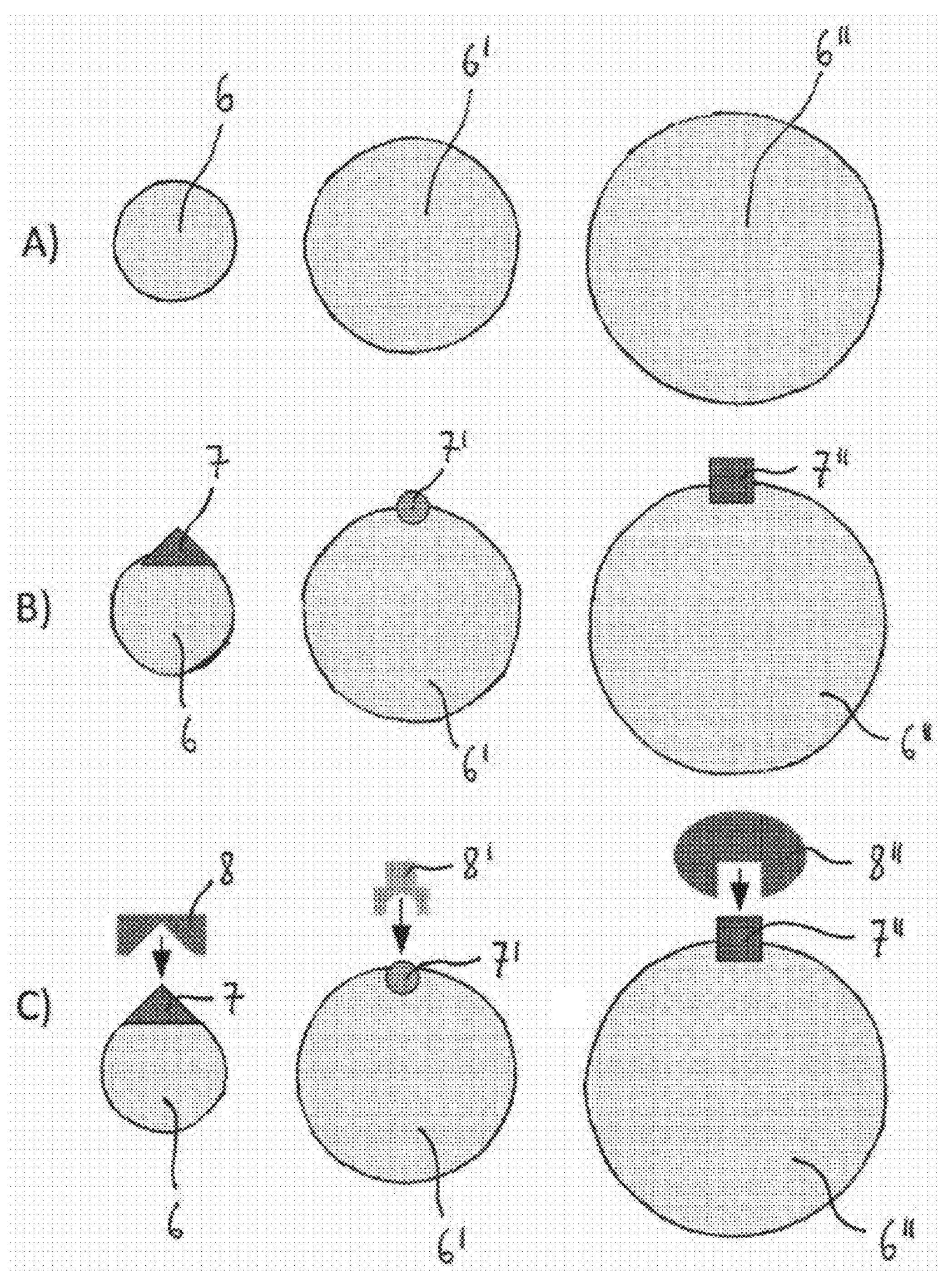

FIG. 3 schematically shows the manufacture of three groups having solid phase particles 6, 6', 6" of mutually different sizes, with the solid phase particles 6, 6', 6" of each group respectively having reversibly bound to a specific binding molecule 7, 7', 7" at the surface. In a first step, three groups of solid phase particle 6, 6', 6" are provided that each have solid phase particles 6, 61, 6" having a hydrodynamic radius differing among the groups (FIG. 3A). In a second step, a specific chemical functionalization of the surface of solid phase particles 6, 61, 6" takes place so that the solid phase particles 6, 61, 6'" of each group expose a specific binding molecule 7, 7', 7" at their surface and the specific binding molecule 7, 7', 7" differs among the three groups (FIG. 3B). In a third step, a binding takes place of particles 8, 81, 8" (e.g., blood cells) of the liquid that comprises the particles 8, 81, 8" to be separated to the solid phase particles 6, 6', 6" of the respective groups. The binding takes place such that each of the three groups of solid phase particles 6, 61, 6" only binds specific particles 8, 8', 8" (e.g., specific blood cells such as B cells or T cells). Particles 8, 8', 8" of the same size (such as B cells and T cells) can also be separated from one another by this measure since they are bound to considerably larger solid phase particles 6, 6', 6"

and the latter determine the respective hydrodynamic radius of the complexes produced. A respective specific hydrodynamic radius that determines the separation properties of the particles of the same size 8, 81, 8" by the filter element is thus respectively "imparted" to said particles 8, 8', 8" of the same size.

Figure 4:
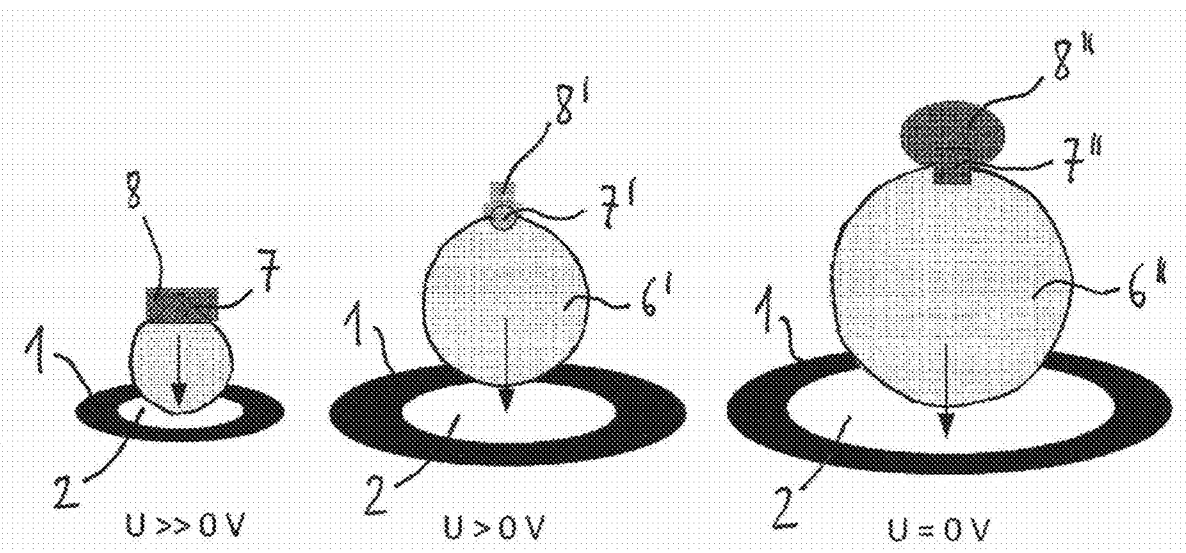

FIG. 4 schematically shows a penetration of a pore 2 of the filter element 1 by the respective solid body particles 6, 6', 6". Since the solid body particles 6, 6', 6" are each bound to a respective kind of particle of the particles 8, 8', 8" to be separated via a specific binding molecule 7, 7', 7" and have a considerably larger diameter than the particles 8, 8', 8" to be separated, the possibility of the particles 8, 8', 8" to be separated passing through the pores 2 of the filter element 1 is determined by the solid body particle 6, 6', 6" to which they are bound. If a high electrical voltage is applied to the filter element 1 (left image), the pore diameter of its pores 2 is relatively small. The particles 8 can now consequently pass through the pore 2 that are bound to the relatively smallest solid body particles 6. If a lower electrical voltage is applied to the filter element 1 (middle image), the pore diameter of its pores 2 becomes larger. The particles 8' can now consequently pass through the pore 2 that are bound to larger body particles 6'. If no electrical voltage is applied to the filter element 1 (right image), the pore diameter of its pores 2 adopts the largest value (maximum value). Only the particles 8" can consequently pass through the pore 2 that are bound to the largest solid body particles 6".

Figure 5:
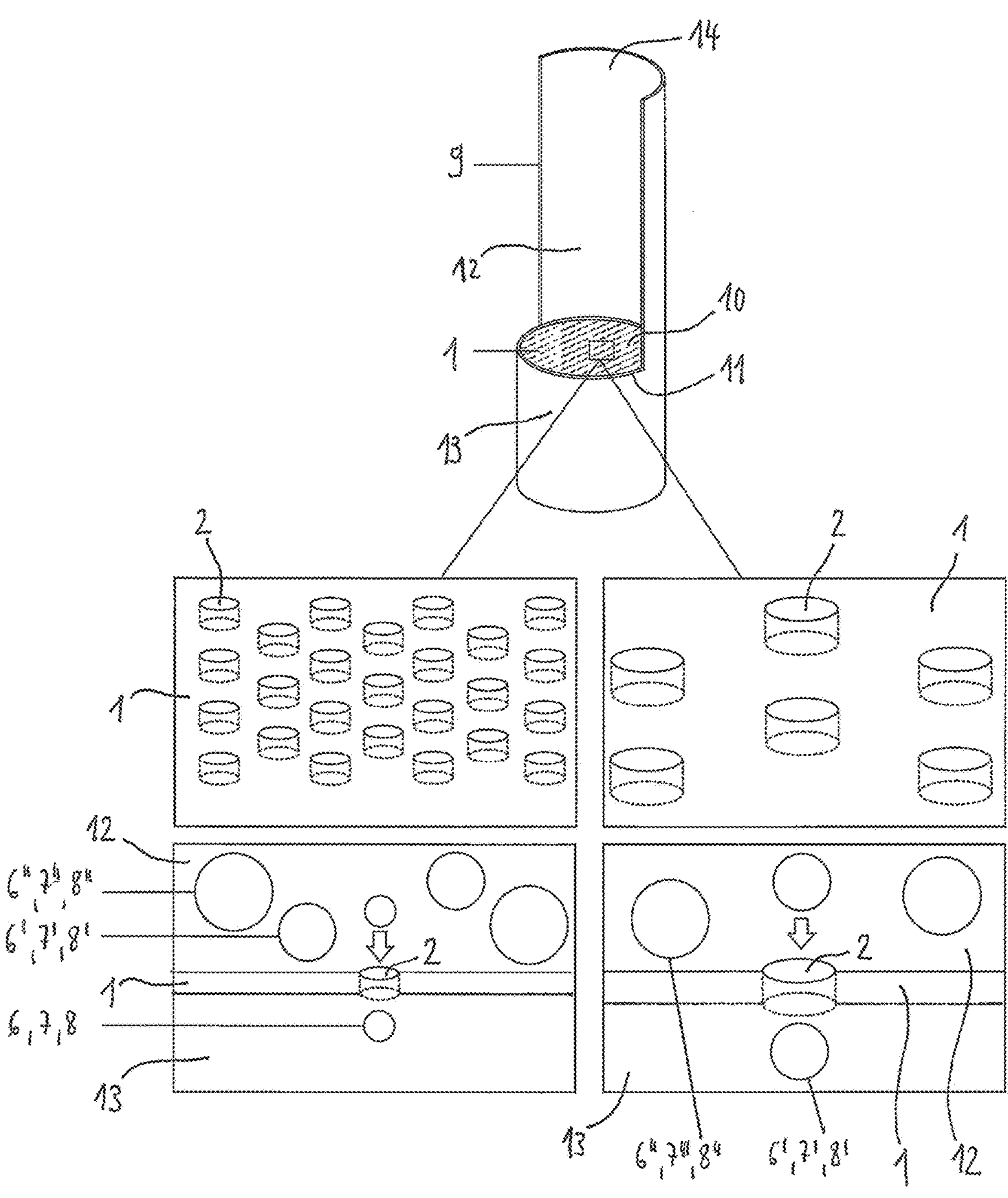

FIG. 5 schematically shows a device in accordance with the invention for separating particles in a liquid that is here designed in the form of a cartridge. The device comprises a container 9 for receiving a liquid (suspension) and a planar filter element 1 having an upper side surface 10 and a lower side surface 11, with the filter element 1 having continuous pores 2 having a defined pore diameter. The filter element 1 is arranged in the container 9 such that it divides the container 9 into an upper compartment 12 having an opening 14 in the direction of the upper side surface 10 of the filter element 1 and into a lower compartment 13 in the direction of the lower side surface 11 of the filter element 1 so that particles of a liquid in the upper compartment 12 can only move into the lower compartment 13 if they pass through the filter element 1, with the upper compartment 12 of the container 9 having an opening 14 for receiving a liquid having particles. The device is characterized in that the upper compartment 12 of the container 9 comprises at least one group of solid phase particles 6, 6', 6" that have a specific hydrodynamic diameter and that expose at least one molecule 7, 7', 7" at their surface (not shown separately) that is suitable to specifically bind to a surface molecule of a first kind of particle 8, 8', 8" (not shown separately). The filter material 1 comprises or consists of a material that is suitable to change the pore diameter of its pores 2 by application of an electrical voltage to the filter element 1 and/or by the action of a mechanical force on the filter element 1. It is shown in the lower part of FIG. 5 how initially only the smaller binding complexes 6, 7, 8 can pass through the pores 2 of the filter element 1 in the case of a small pore diameter of the pores 2 of the filter element 1 and can move from the upper compartment 12 of the container 9 into the lower compartment 13 of the container 9. If the pore diameter of the pores 2 of the filter element 1 is subsequently enlarged by application of an electrical voltage and/or by the action of a mechanical force, the larger binding complexes 6', 7', 8' can now also pass through the pores 2 of the filter element and can move from the upper compartment 12 of the container 9 into the lower compartment 13 of the container.

Example 1—Manufacture of Suitable Solid Phase Particles

The solid phase particles used in the device can be manufactured effectively, quickly adaptably, potentially high scalably, and resource savingly in water in oil emulsions.

Water based agarose is here, for example, applied into an oil phase in a liquid phase, with the agarose deforming into droplets or beads. After a subsequent polymerization of the agarose, the beads can be washed and functionalized. This method produces solid phase particles of agarose with a polydisperse size distribution. The size distribution can be precisely set by the variation of the manufacturing parameters such as the agarose to oil ratio or oil viscosity.

It is advantageous if the produced solid phase particles have a size variation of less than 10 μm, that is are relatively homodisperse. It is furthermore advantageous if a plurality of different size fractions of solid phase particles are produced, with the difference of the mean diameters of the solid phase particles between the individual fractions amounting to preferably at least 10 μm.

Fractions are, for example, provided in which the solid phase particles within a fraction have a size variation of less than 10 μm and in which the mean diameter of the solid phase particles of a first fraction amounts to 40 μm, of a second fraction to 50 μm, of a third fraction to 60 μm, of a fourth fraction to 70 μm, of a fifth fraction to 80 μm, of a sixth fraction to 90 μm, of a seventh fraction to 100 μm, of an eighth fraction to 110 μm, and of a ninth fraction to 120 μm.

Example 2—Binding a Binding Molecule to the Solid Phase Particles

Chemically covalent Strep-Tactin® is, for example, bound (e.g., via a chemical coupling process) to the solid phase particles (e.g., agarose particles) to bind a specific molecule that is suitable to specifically bind to a surface molecule of a first kind of particle. An antibody fragment (e.g., fab fragment) that has chemically covalently bound (e.g., via microbiological production of a protein that comprises both the antibody fragment and the Step-Tag®) a Strep-Tag® can, for example, be used as a binding molecule. If the modified solid phase particles are now combined with the modified antibody fragments in a watery solution, both bind to one another via a noncovalent (and reversible) Strep-Tactin®-Strep-Tag® binding, i.e., a binding complex is produced.

If the antibody fragment is selected such that it, for example, only binds T cells, T cells can be found to the solid phase particles via the binding to the fab fragment that is in turn immobilized via the Strep-Tactin®-Strep-Tag® binding via noncovalent interactions on the solid phase particle. The noncovalent Strep-Tectin®-Strep-Tag® binding is reversible and can be separated by setting a specific biotin concentration in the aqueous solution. In other words, the T cells bound to the solid phase particles after the separation has taken place can in turn again be separated from the solid phase particles via the addition of biotin.

Example 3—Manufacture of a Filter Membrane Having a Selective Pore Size

The manufacture of a membrane that comprises a dielectric elastomer is known from the prior art (see e.g., DE 10 2012 016 375 A1). Such membranes can be used to manufacture a filter element such as is used in the method in accordance with the invention and in the device in accordance with the invention.

It is furthermore known that such membranes can be structured via the effect of electromagnetic radiation (e.g., of a laser) (see e.g., DE 10 2012 016 378 A1).

To manufacture a filter membrane suitable for the device in accordance with the invention and for the method in accordance with the invention, an array of continuous pores having a defined pore diameter is introduced, for example, into a filter membrane that comprises or consists of a dielectric polymer. Pores having a "defined" pore diameter means that the pore diameter of all the pores of the filter element varies by less than 10 μm, preferably less than 5 μm. Pores having these requirements can, for example, be inserted into the filter membrane via an electromagnetic radiation of a laser.

Example 4—Method for Separating Particles in a Liquid

In a first step, different fractions of solid phase particles of different sizes (e.g., in accordance with Example 1) are produced.

In a second step, they are respectively functionalized with the different cell specific binding molecules (e.g., in accordance with Example 2).

In a third step, a filter membrane for separating the particles is provided (e.g., in accordance with Example 3).

In a fourth step, the solid phase particles (e.g., agarose particles) of different sizes are contacted by a liquid that comprises the particles to be separated (e.g., blood cells and vesicles of blood). In this respect, specific kinds of particles (specific blood cells) specifically bind to solid phase particles of a specific size, whereby the size of the solid phase particles is placed on ("imparted to") them.

In a fifth step, the particles bound to the respective solid phase particles (e.g., blood cells) are separated stepwise, starting with the smallest fraction of the solid phase particles, via the filter membrane, with the pore diameter of the filter membrane being increased stepwise for this purpose.

REFERENCE NUMERAL LIST

1: filter element;
2: pore of the filter element
3: electrical voltage source
4, 4': electrically conductive layer
5, 5': isolation layer
6, 6', 6": solid phase particles
7, 7', 7": binding molecule
8,8',8": particles of the solution (suspension) to be separated

The invention claimed is:

1. A device for separating particles in a liquid comprising
a) a container for receiving the liquid;
b) an areal filter element having an upper side surface and a lower side surface,
wherein the filter element has continuous pores having a defined pore diameter;
wherein the filter element is arranged in the container such that it divides the container into an upper compartment in the direction of the upper side surface of the filter element and into a lower compartment in the direction of the lower side surface of the filter element, so that particles of a liquid in the upper compartment can only move into the lower compartment if they pass through the filter element, with the upper compartment of the container having an opening for receiving the liquid containing particles,
wherein
the upper compartment of the container comprises at least one group of solid phase particles that have a specific hydrodynamic diameter and that expose at least one molecule at their surface that is suitable to specifically bind to a surface molecule of a first kind of particle; and
the filter material comprises a material that is suitable to change, by application of an electrical voltage to the filter element and/or by the action of a mechanical force on the filter element, the diameter of its pores.

2. The device in accordance with claim 1, wherein the upper compartment of the container comprises at least one second group of solid phase particles having a second hydrodynamic diameter, with the second hydrodynamic diameter differing from the specific hydrodynamic diameter, and with the at least one second group of solid phase particles exposing a molecule at their surface that is suitable to specifically bind to a surface molecule of the second group.

3. The device in accordance with claim 2, wherein the upper compartment of the container comprises at least one third group of solid phase particles having a third hydrodynamic diameter, with the third hydrodynamic diameter differing from the first and second hydrodynamic diameters, and with the third group of solid phase particles exposing a molecule at their surface that is suitable to bind to a surface molecule of a third kind of particle.

4. The device in accordance with claim 3, wherein the upper compartment further includes a fourth, fifth, sixth, seventh, eighth, ninth, and/or tenth group of solid phase particles each comprising a hydrodynamic diameter that differs from other groups of solid phase particles in the upper compartment, and with the solid phase particles of the respective groups exposing a molecule at their surface that is suitable to specifically bind to a surface molecule of a respective other kind of particle.

5. The device in accordance with claim 1, wherein the at least one molecule that is exposed at the surface of the solid phase particles and that is suitable to specifically bind to a surface molecule of a first kind of particle
i) comprises a polypeptide chain; and/or
ii) comprises a polynucleotide; and/or
iii) comprises an oligosaccharide; and/or
iv) is reversibly bound to the surface of the solid phase particles via non-covalent interactions; and/or
v) is suitable to specifically bind to a surface molecule of a kind of particle that has a smaller hydrodynamic diameter than the solid phase particles.

6. The device in accordance with claim 5, wherein
i) the polypeptide chain is selected from the group consisting of antibodies, antibody fragment, and derivatives thereof; and/or
ii) the polynucleotide is selected from the group consisting of DNA, RNA, and derivatives thereof; and/or
iii) is reversibly bound to the surface of the solid phase particles via non-covalent interactions such that the binding is releasable via a measure selected from the group consisting of changing a concentration of a substance, changing a temperature, changing the pH, and combinations thereof; and/or
v) the smaller hydrodynamic diameter is a hydrodynamic diameter that amounts to a maximum of 10% of the hydrodynamic diameter of the solid phase particles.

7. The device in accordance with claim 1, wherein the device has at least two electrically conductive layers that are connected to an electrical voltage source, with at least one of the at least two electrically conductive layers, optionally the at least two electrically conductive layers i) are applied to the upper side or to the lower side of the filter element, with optionally one of the layers being applied to the upper side of the filter element and the other being applied to the lower side of the filter element; and/or ii) at least one electrical insulation layer being arranged between the at least one electrically conductive layer and the filter element, with the at least two electrically conductive layers, optionally each contacting at least one electrical insulation layer that is arranged between the at least two electrically conductive layers and the filter element; and/or iii) are arranged in a marginal region of the pores of the filter element; and/or iv) are fully arranged around the pores of the filter element and having continuous pores having a defined pore diameter at the same points as the filter element; and/or v) comprising a polymer, optionally an electrically conductive polymer; and/or vi) comprising electrically conductive particles, with a portion of the electrically conductive particles optionally being in the range from 0.001 to 30 wt %, relative to the total weight of the electrically conductive layer; and/or vii) comprising a metal; and/or viii) are connected to the filter element or to an electrically insulating layer with a friction-lock and/or a material bond;

wherein at least one of the at least two electrically conductive layers, optionally the at least two electrically conductive layers, is/are applied to the filter element or to an electrically conductive layer via a process selected from the group consisting of pad printing, doctor knife coating, screen printing, inkjet printing, jetting, spraying, vaporization, and combinations thereof, optionally combined with a laser structuring process.

8. The device in accordance with claim 1, wherein the device has an electrical voltage source that is electrically conductively connected to at least two electrically conductive layers.

9. The device in accordance with one claim 1, wherein the device has a means that is suitable to change the pore diameter of its pores by the action of a mechanical force on the filter element, wherein the means is selected from the group consisting of a stamp for exerting a pressure on the filter element, a pneumatic device for exerting a pressure on the filter element, a bimetallic wire for exerting a pressure on the filter element, an NiTiCu alloy for exerting a pressure on the filter element, and combinations thereof.

10. The device in accordance with claim 1, wherein the device has a means that is suitable to apply an oscillating fluid flow to the upper side surface of the filter element.

11. The device in accordance with claim 1, which has a control unit that is configured to control an electrical voltage of a voltage source and/or a mechanical force on the filter element.

12. The device in accordance with claim 1, which has a means that is suitable to move the liquid having particles through the filter element.

13. The device in accordance with claim 1, wherein the filter element comprises a material that i) is electroactive; or ii) is piezoelectric; or iii) is dielectric; or iv) is elastic; or v) is incompressible; or vi) is a polymer.

14. The device in accordance with claim 1, wherein the filter element i) has an extent from the upper side in the direction of the lower side in the range from ≤250 μm; and/or ii) is pretensioned; and/or iii) has continuous pores that have a substantially round cross-section; and/or iv) is suitable to change the pore diameter of its continuous pores by the action of an electrical voltage on the filter element and/or by the action of a mechanical force on the filter element in a range from 10 to 200 μm.

15. The device in accordance with claim 1, wherein the particles are selected from the group consisting of vesicles and biological cells.

16. The device in accordance with claim 1, wherein the solid phase particles i) comprise a polymer; and/or ii) are solid phase spheres.

17. A kit comprising i) a device in accordance with 19; and ii) a unit that has at least one of the following means:

a means that is suitable to apply an electrical voltage to the filter element;

a means that is suitable to apply an oscillating fluid flow; and a means that is suitable to move the liquid having the particles through the filter element.

18. A method for separating particles in a liquid comprising the steps of:

a) providing at least one group of solid phase particles that have a specific hydrodynamic diameter and that expose at least one molecule at their surface that is suitable to specifically bind to a surface molecule of a first kind of particle of the particles of the liquid; and b) incubating the liquid having the at least one group of solid phase particles until the solid phase particles of the at least one group of solid phase particles have been specifically bound to a surface molecule of a first kind of particle of the particles of the liquid;

c) providing a filter element that comprises a material that is suitable to change, by application of an electrical voltage to the filter element and/or by the action of a mechanical force on the filter element, the pore diameter of its pores;

d) setting the pore diameter of the pores of the filter element via application of an electrical voltage to the filter element and/or the action of a mechanical force on the filter element so that only particles up to a desired particle diameter can pass through the filter element, with the set particle diameter being smaller than a hydrodynamic diameter of the at least one group of solid phase particles;

e) moving the liquid through the filter element;

f) isolating the liquid;

g) increasing the pore diameter of the pores of the filter element by reducing the power of the electrical voltage and/or by increasing the mechanical force on the filter element so that particles up to a desired, now larger particle diameter can pass through the filter element;

h) optionally adding a liquid that does not comprise any particles to the liquid having the particles that have not passed through;

i) moving the liquid through the filter element;

j) isolating the liquid that comprises the particles of the first kind of particle;

k) optionally repeating steps g) to j) until all the particles of the liquid are present separated by their size in separate liquids.

19. The method for separating particles in a liquid in accordance with claim 18, wherein the separation is carried out in a device comprising a) a container for receiving the liquid;

b) an areal filter element having an upper side surface and a lower side surface, wherein the filter element has continuous pores having a defined pore diameter;

wherein the filter element is arranged in the container such that it divides the container into an upper compartment in the direction of the upper side surface of the filter element and into a lower compartment in the direction of the lower side surface of the filter element, so that particles of a liquid in the upper compartment can only move into the lower compartment if they pass through the filter element, with the upper compartment of the container having an opening for receiving the liquid containing particles, wherein the upper compartment of the container comprises at least one group of solid phase particles that have a specific hydrodynamic diameter and that expose at least one molecule at their surface that is suitable to specifically bind to a surface molecule of a first kind of particle; and the filter material comprises a material that is suitable to change, by application of an electrical voltage to the filter element and/or by the action of a mechanical force on the filter element, the diameter of its pores.

20. The method in accordance with claim 19, comprising:

i) setting the pore diameter of the pores of the filter element of the device via application of an electrical voltage to the filter element and/or via the action of a mechanical force on the filter element so that only particles up to a desired particle diameter can pass through the filter element, with the set particle diameter being smaller than a hydrodynamic diameter of the at least one group of solid phase particles;

ii) filling the upper compartment of the container of the device with a liquid that comprises particles having different sizes;

iii) incubating the liquid in the upper compartment of the container of the device having the at least one group of solid phase particles until at least solid phase particles of the at least one group of solid phase particles have specifically bound to a surface molecule of a first kind of particle of the particles;

iv) moving the liquid through the filter element of the device into the lower compartment of the container;

v) isolating the liquid having the particles that have passed through from the lower compartment of the container of the device;

vi) increasing the pore diameter of the pores of the filter element of the device by reducing the power of the electrical voltage and/or by increasing a mechanical force on the filter element so that particles up to a desired, now larger particle diameter can pass through the filter element;

vii) optionally filling the upper compartment of the container of the device with a liquid that does not comprise any particles;

viii) moving the liquid through the filter element of the device into the lower compartment of the container;

ix) isolating the liquid that comprises the particles of the first kind of particles from the lower compartment of the container of the device; and x) optionally repeating steps vi) to ix) until all the particles of the liquid are present separated by their size in separate liquids.

* * * * *